United States Patent [19]

Kaito et al.

[11] Patent Number: 4,876,112
[45] Date of Patent: Oct. 24, 1989

[54] PROCESS FOR FORMING METALLIC PATTERNED FILM

[75] Inventors: Takashi Kaito; Tatsuya Adachi, both of Tokyo, Japan

[73] Assignee: Seiko Instruments Inc., Japan

[21] Appl. No.: 31,946

[22] Filed: Mar. 27, 1987

[30] Foreign Application Priority Data

May 29, 1986 [JP] Japan ............... 61-124146

[51] Int. Cl.$^4$ .............................. B05D 3/06
[52] U.S. Cl. .................... 427/38; 427/252; 427/253; 427/286; 427/299; 427/398.1; 437/228; 437/245; 437/929; 437/930; 437/935
[58] Field of Search ............ 427/38, 252, 253, 286, 427/299, 398.1; 437/228, 245, 929, 930, 935

[56] References Cited

U.S. PATENT DOCUMENTS

| | | | |
|---|---|---|---|
| 4,042,006 | 8/1977 | Engl et al. | 164/46 |
| 4,372,989 | 2/1983 | Menzel | 427/53.1 |
| 4,609,809 | 9/1986 | Yamaguchi et al. | 219/121 EM |
| 4,612,085 | 9/1986 | Jelks et al. | 427/38 X |
| 4,615,904 | 10/1986 | Ehrlich et al. | 427/38 |

FOREIGN PATENT DOCUMENTS 60-94728  5/1985  Japan.
60-182726 9/1985  Japan.

Primary Examiner—Bernard Pianalto
Attorney, Agent, or Firm—Bruce L. Adams; Van C. Wilks

[57] ABSTRACT

A process of forming a metal pattern film on a designated area of a substrate. A vapor stream of a decomposable hexacarbonyl metal compound is directed toward the substrate designated area to form thereon a layer of the decomposable hexacarbonyl metal compound. This layer is irradiated with a focused metal ion beam to decompose the hexacarbonyl metal compound into the gaseous carbonyl component and solid metal component to thereby deposit the solid metal component on the substrate designated area.

22 Claims, 2 Drawing Sheets

PROCESS FOR FORMING METALLIC PATTERNED FILM

BACKGROUND OF THE INVENTION

The present invention relates to a process and apparatus for additionally forming a metallic patterned film on a semiconductor device for wiring or on an exposure photomask (and X-ray mask) for light shielding. The process and apparatus are used to change wiring routes or detect defective wiring on a semiconductor device or to repair defects or change patterns on a photomask.

There is disclosed in "Semiconductor World" (January 1986, pp. 97-100, by M. Yamamoto) a process and apparatus for repairing the photomask by using a converging ion beam. The process and apparatus is used to form a carbon film useful as a light-shielding film of an optical lithography mask. The ion beam is also used to form a metallic patterned film. The result of investigations in this field is reported in "The 17th Symposium on Ion Implantation and Submicron Fabrication" by D. Takehara et al., March 1986, pp. 153-156. According to this report, the converging ion beam is replaced by a broad rare gas ion beam, and $WF_6$ or $Ta(OC_2H_5)_5$ is used as a source gas, whereby a film of W or Ta is formed. The thus formed film contains such a large amount of oxygen and has such a high specific resistance of about 1 $\Omega$·cm that it is not suitable for wiring.

As mentioned above, the prior art is capable of performing maskless film deposition with an ion beam, but is not capable of forming a fine metallic patterned film suitable for adding or changing wiring routes on a semiconductor device or for repairing defects in a metal pattern for X-ray mask.

SUMMARY OF THE INVENTION

The present invention aims to solve the above-mentioned problems. The means to solve the problems is comprised of a converging ion beam generator, a deflecting electrode to deflect the converging ion beam for scanning, an X-Y stage on which is placed a substrate to be irradiated with the converging ion beam, a gas gun to blow a direct vapor stream of a carbonyl metal compound in the form of a hexacarbonyl metal toward the substrate locally in the vicinity of the area irradiated with the converging ion beam, and a mechanism to cool the substrate. The hexacarbonyl metal is $W(CO)_6$, $Mo(CO)_6$, or $Cr(CO)_6$. The source gas of the gas gun is heated to $+40°$ to $+60°$ C. The substrate is kept cooled at a prescribed temperature in the range of $+25°$ to $-50°$ C. The ion particles for the converging ion beam are any of Ga ion, Au ion, Bi ion, or Pb ion which are readily obtained from a fused metal ion source.

The means constructed as mentioned above functions in the following manner. The gas gun effectively directs a vapor of hexacarbonyl metal toward a substrate locally in the area or in the vicinity of the area irradiated with the ion beam. The vapor of hexacarbonyl metal is adsorbed on the substrate surface because the substrate is cooled by the cooling mechanism. The substrate surface which has adsorbed the hexacarbonyl metal is then irradiated with the converging ion beam which is generated by the converging ion beam generator and is converged and controlled for scanning by the deflection electrode, scanning controller, and scanning area setting device. While the vapor of hexacarbonyl metal is continuously supplied, the scanning of the converging ion beam is repeated. This process forms a metallic patterned film having a film thickness proportional to the repeating number of scanning.

It is an object of the invention to provide a fine metallic pattern on a substrate for a X-ray mask or a semiconductor device.

Other and further objects, features and advantages of the invention will appear more fully from the following description.

DETAILED DESCRIPTION

The invention is described in more detail with reference to the accompanying drawings.

Figure 1:
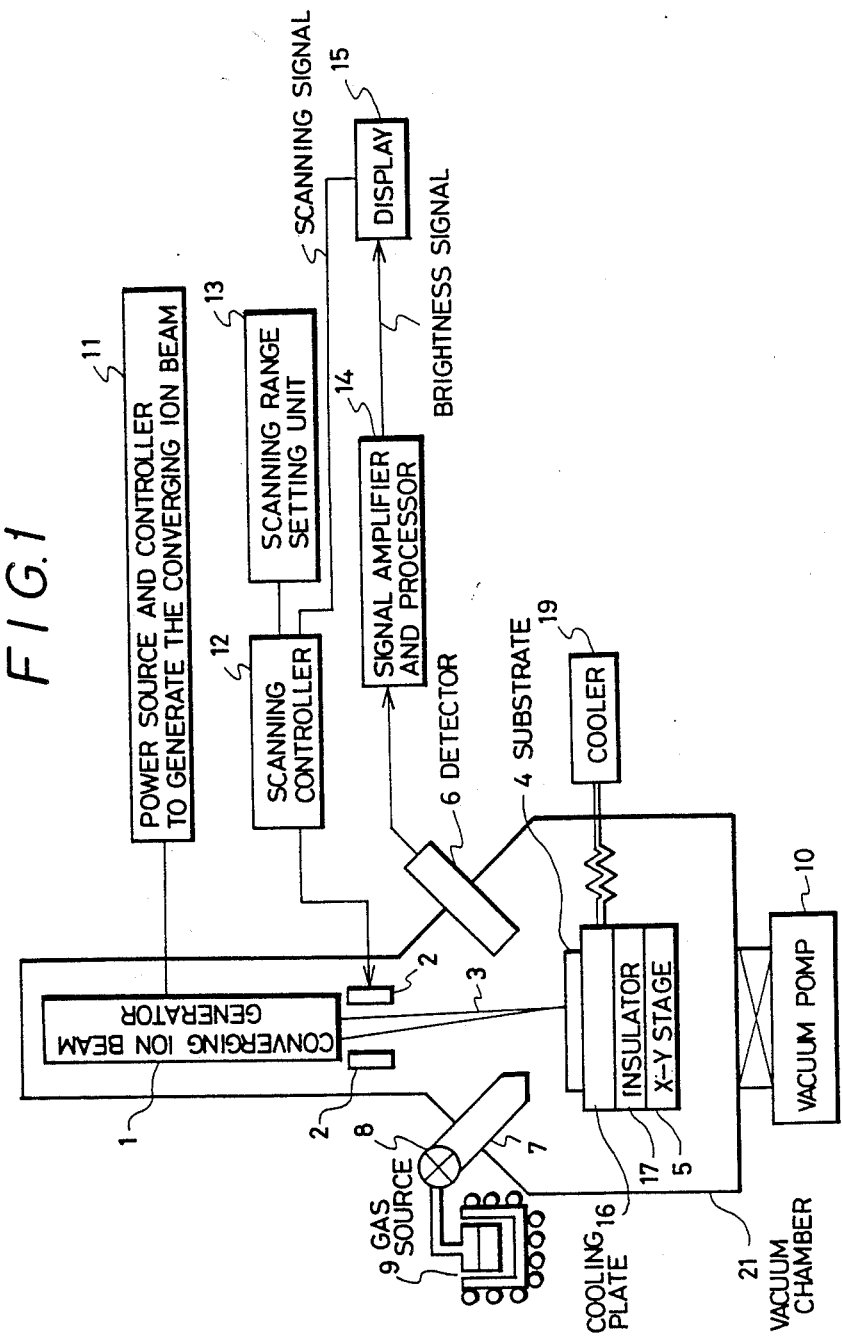
FIG. 1 is a schematic diagram illustrating the process and apparatus for forming a metallic patterned film according to the invention.
Figure 2:
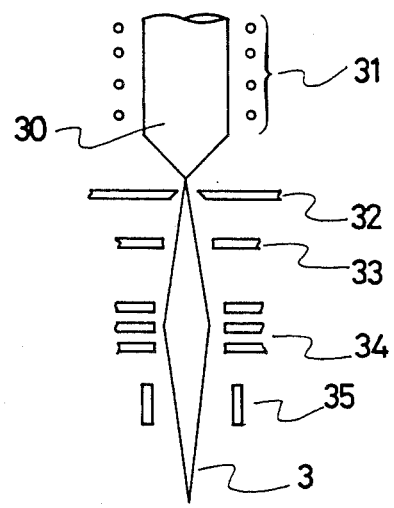
FIG. 2 is a block diagram showing the converging ion beam generator.

The converging ion beam generator 1 is shown in FIG. 2. The substance 30 to be ionized is, made Ga metal, which is surrounded by a heater 31 to heat and fuse the surface only. The fused Ga metal is extracted by the extracting electrode 32 so that it is converted into Ga ions. The Ga ions are further heated by the heating electrode 33. The heated Ga ions are converged or focused into a focused metal ion beam by the converging lens system 34. The ion beam directed to the substrate is turned on and off by the blanking electrode 35. The converging ion beam generator 21 is disposed in a vacuum chamber 21 connected to the vacuum pump 10.

The ion beam 3 generated and controlled as mentioned above is irradicated onto the substrate 4 placed on the cooling plate 16 supported by the X-Y stage through the insulator 17. The ion beam 3 is caused to scan the substrate 4 by the deflection electrode 2 (for the X and Y directions). The secondary charged particles released from the surface of the substrate 4 are detected by the secondary charged particles detector 6. The detected information is converted into brightness signals after amplification and processing by the signal amplifier/processor 14. The signals together with the scanning signal from the scanning controller 12 enter are applied to the display 15, on which the image of secondary charged particles is displayed. The image of secondary charged particles is used to locate the position on the substrate 4 where the metallic patterned film is to be made, and the area for the metallic patterned film is designated by the scanning range setting unit 13. Upon receipt of a signal for the start of deposition, the valve 8 of the gas gun 7 is opened and the vapor stream of hexacarbonyl metal is directed toward the surface of the substrate 4. At this time, the gas source 9 is heated at a prescribed temperature by a heater, and the substrate 4 is kept cooled at a prescribed temperature by the cooling plate 16 connected to the cooler 19. Thus, the surface of the substrate 4 which has adsorbed the vapor of hexacarbonyl metal is irradiated with the converging ion beam which is controlled by the scanning range setting unit 13 with respect to a scanning range and scanning frequency. In the area irradiated with the converging ion beam, the hexacarbonyl metal is decomposed with the result that CO gas component dissipates into the vacuum or the vacuum chamber 21 and the metal component deposits on the surface of the substrate. When the scanning of the converging ion beam 3 is repeated while the vapor of hexacarbonyl metal is continuously supplied, there is formed a metallic patterned film having a thickness proportional to the number of repeated.

According to the present invention, the source gas for film formation is a hexacarbonyl metal vapor instead of the conventional metal halide vapor. The hexacarbonyl metal vapor can be effectively adsorbed by the surface of the substrate at a temperature slightly lower than room temperature, without being cooled to the liquefied nitrogen temperature. This leads to the faster film growth and the formation of film superior in conductivity and film adhesion. In an example in which the source gas is $W(CO)_6$ and the converging ion beam is of Ga ions, the resulting film has a specific resistance of about $10^{-4}$ to $10^{-5}$ $\Omega$·cm and submicron lines of pattern can be obtained. The film is composed mainly of W, and it contains very little oxygen joined bonded to Ga and C. In addition, the film has sufficiently high hardness and adhesion. Therefore, the film formed by the process of this invention is suitable for forming new wiring routes or paths on a semiconductor device and for repairing a defective metallic pattern on an X-ray mask. For the repair of an X-ray mask, the converging ion beam should be of heavy metal ions (such as Au ions, Bi ions, and Pb ions) and the source gas should be $W(CO)_6$ so that there is formed a film having a greater coefficient of X-ray absorption.

What is claimed is:

1. A process for forming a new wiring path on a semiconductor device, comprising: providing a semiconductor device having a designated area on which a new wiring path is to be formed; forming a layer of decomposable carbonyl metal compound composed of carbonyl and metal components on the designated area of the semiconductor device by directing a vapor stream of decomposable carbonyl metal compound onto the designated area; and converting the layer of decomposable carbonyl metal compound into a new wiring path on the designated area of the semiconductor device by irradiating the layer with a focused ion beam to decompose the carbonyl metal compound layer into a gaseous carbonyl component which dissipates and a solid metal component which deposits as the new wiring path on the semiconductor device.

2. A process according to claim 1; wherein the decomposable carbonyl metal compound comprises a hexacarbonyl metal compound.

3. A process according to claim 1; wherein the decomposable carbonyl metal compound has a metal component selected from the group consisting of W, Mo and Cr.

4. A process according to claim 1; wherein the focused ion beam is composed of ions selected from the group consisting of Ga ions, Au ions, Bi ions and Pb ions.

5. A process according to claim 1; including cooling the semiconductor device prior to irradiation by the focused ion beam to promote the formation of the layer of carbonyl metal compound.

6. A process for forming a new wiring route on a semiconductor device by using an apparatus which has an ion beam generator comprised of a metal ion source for generating an ion beam, a focusing lens system to focus the ion beam from the metal ion source, a blanking electrode to turn on and off the ion beam, a deflecting electrode to deflect the focused ion beam for scanning the same, an X-Y stage movable in the X-Y directions for mounting thereon a semiconductor device to be irradiated with the focused ion beam, a gas gun to direct a hexacarbonyl metal gas stream against the surface of the semiconductor device where the focused ion beam is irradiated, a gas source to supply hexacarbonyl metal gas to the gas gun, and a detector for detecting secondary charged particles which are generated by the irradiation of the semiconductor device with the focused ion beam, the process comprising the steps of: directing a vapor stream of hexacarbonyl metal toward a predetermined surface portion of the semiconductor device at which a new wiring route is to be formed; and irradiating the predetermined surface portion on which the hexacarbonyl metal is adsorbed with a focused ion beam to thereby decompose the hexacarbonyl metal to deposit a new wiring route on the predetermined surface portion of the semiconductor device.

7. A process as claimed in claim 6; wherein the focused ion beam is composed of Ga ions, Au ions, Bi ions or Pb ions.

8. A process as claimed in claim 6; wherein the hexacarbonyl metal comprises $W(CO)_6$, $Mo(CO)_6$ or $Cr(CO)_6$.

9. A process for forming a new wiring path on a semiconductor device, comprising the steps of: providing a semiconductor device; designating an area of the semiconductor device on which a new wiring path is to be formed; forming a vapor stream of a decomposable carbonyl metal compound composed of a carbonyl component and a metal component; directing the vapor stream toward the designated area of the semiconductor device to form thereon a layer of the decomposable carbonyl metal compound; and irradiating the layer with an ion beam to decompose the carbonyl metal compound into a gaseous carbonyl component and a solid metal component to thereby deposit the solid metal component as a new wiring path on the designated area of the semiconductor device.

10. A process according to claim 9; wherein the decomposable carbonyl metal compound comprises a hexacarbonyl metal.

11. A process according to claim 10; wherein the decomposable carbonyl metal compound is composed of a metal component selected from the group consisting of W, Mo and Cr.

12. A process according to claim 9; wherein the ion beam is comprised of ion particles of a metal.

13. A process according to claim 11; wherein the metal is selected from the group consisting of Ga, Au, Bi and Pb.

14. A process according to claim 9; including the step of cooling the semiconductor device below room temperature to promote adsorption of the carbonyl metal compound on the designated area thereof to thereby promote the formation of the layer of carbonyl metal compound.

15. A method of forming a new wiring path on a semiconductor device using an apparatus having means defining a chamber for receiving a semiconductor device, directing means operable for directing a vapor stream toward the semiconductor device, and irradiating means operable for irradiating the semiconductor device with a focused ion beam, the method comprising the steps of: mounting a semiconductor device in the chamber; designating a specific area of the semiconductor device at which a new wiring path is to be formed; supplying a vapor of a decomposable carbonyl metal compound composed of a carbonyl component and a metal component to the directing means; operating the directing means to direct a vapor stream of carbonyl metal compound vapor toward the designated area of the semiconductor device to thereby form thereon a layer of the carbonyl metal compound; and operating the irradiating means to irradiate the layer with a focused ion beam to decompose the carbonyl metal compound into a gaseous carbonyl component and a solid metal component so as to deposit the solid metal component as a new wiring path on the designated area of the semiconductor device.

16. A method according to claim 15; wherein the mounting step comprises mounting the semiconductor device displaceably in X and Y directions perpendicular to the direction of irradiation of the ion beam.

17. A method according to claim 15; wherein the supplying step comprises supplying a vapor of a decomposable hexacarbonyl metal.

18. A method according to claim 17; wherein the decomposable hexacarbonyl metal is selected from the group consisting of $W(CO)_6$, $Mo(CO)_6$ and $Cr(CO)_6$.

19. A method according to claim 15; including the step of supplying ion particles of a metal to the irradiating means to enable the same to irradiate the designated area of the semiconductor device with a metal ion beam.

20. A method according to claim 19; wherein the metal is selected from the group consisting of Ga, Au, Bi and Pb.

21. A method according to claim 15; wherein the second operating step includes scanning the focused ion beam within the designated area of the semiconductor device so as to control the thickness of the deposited new wiring path.

22. A method according to claim 15; including the step of cooling the semiconductor device below room temperature to promote adsorption of the carbonyl metal compound on the designated area thereof to thereby promote the formation of the layer of carbonyl metal compound.

* * * * *